United States Patent [19]
Dhong et al.

[11] Patent Number: 4,927,779
[45] Date of Patent: May 22, 1990

[54] COMPLEMENTARY METAL-OXIDE-SEMICONDUCTOR TRANSISTOR AND ONE-CAPACITOR DYNAMIC-RANDOM-ACCESS MEMORY CELL AND FABRICATION PROCESS THEREFOR

[75] Inventors: Sang H. Dhong, Mahopac; Nicky C. Lu, Yorktown Heights; Walter H. Henkels, Putnam Valley, all of N.Y.

[73] Assignee: International Business Machines Corporation, Armonk, N.Y.

[21] Appl. No.: 428,159

[22] Filed: Oct. 27, 1989

Related U.S. Application Data

[62] Division of Ser. No. 230,410, Aug. 10, 1988.

[51] Int. Cl.⁵ .................. H01L 21/265; H01L 27/10
[52] U.S. Cl. .......................................... 428/52; 437/38;
437/47; 437/60; 437/203; 437/228; 437/919;
437/915
[58] Field of Search ............... 437/38, 47, 52, 60,
437/203, 228, 919, 915; 357/23.6, 51; 365/188;
156/643, 644

[56] References Cited
U.S. PATENT DOCUMENTS 4,489,478 12/1984 Sakurai ........................... 437/915
4,498,226 2/1985 Inoue et al. ..................... 437/915
4,630,088 12/1986 Ogura et al. ..................... 357/23.6
4,646,731 4/1987 Lam et al. ....................... 437/915
4,651,408 3/1987 MacElwee ....................... 437/915
4,670,768 2/1987 Sunami et al. ................... 357/23.6
4,772,568 9/1988 Jastrzebeski .................... 437/915

FOREIGN PATENT DOCUMENTS 0198590 10/1986 European Pat. Off. .
19366 1/1984 Japan .

OTHER PUBLICATIONS

Nicky C. C. Lu, "Advanced Cell Structures for Dynamic RAMs", IEEE Circuits and Devices Magazine, vol. 5, No. 1, Jan. 1989, pp. 27–34.

Primary Examiner—Brian E. Hearn
Assistant Examiner—T. Thomas
Attorney, Agent, or Firm—John J. Goodwin

[57] ABSTRACT

A complementary MOS one-capacitor dynamic RAM cell which operates with a non-boosted wordline without a threshold loss problem and which includes one storage capacitor and n- and p-type transfer devices connected to the storage capacitor which function as two complementary transistor devices having gates controlled by complementary signals on the RAM wordlines.

5 Claims, 3 Drawing Sheets

COMPLEMENTARY METAL-OXIDE-SEMICONDUCTOR TRANSISTOR AND ONE-CAPACITOR DYNAMIC-RANDOM-ACCESS MEMORY CELL AND FABRICATION PROCESS THEREFOR

BACKGROUND OF THE INVENTION

This is a divisional of application Ser. No. 07/230410, filed 8-1088, pending.

FIELD OF THE INVENTION

The present invention relates to a semiconductor memory using complementary metal-oxide-semiconductor transistors and a storage capacitor, and more particularly to a structure and fabrication process for a random-access-memory cell for dynamic operation for large scale integrated circuit technology.

DESCRIPTION OF THE PRIOR ART

U.S. Pat. No. 4,633,438 issued Dec. 30, 1986 to Kume et al, entitled "STACKED SEMICONDUCTOR MEMORY", describes a 3-transistor random access memory for dynamic operation, in which one of the transistors is stacked on the other transistor. A transistor for writing is disposed on a transistor for reading, and one of its terminals is used in common with the gate electrode of a transistor for judging data. The other terminal is connected to one of the terminals of the transistor for reading.

A memory cell capable of extremely large scale integration can be obtained using stacked complementary FETs, wherein the two FETs are driven by overlapping wordlines; however, the wordlines are separately driven for read and write operations, rather than simultaneously driven with complementary signals as in the present invention.

U.S. Pat. No. 4,271,488 issued Jan. 2, 1981 to Saxe entitled "HIGH-SPEED ACQUISITION SYSTEM EMPLOYING AN ANALOG MEMORY MATRIX", describes a high-speed acquisition system employing an analog memory matrix in which sample-hold elements connected to an analog bus are arranged in rows and columns to form an M×N matrix. The system is operable in a fast in - slow out mode, and the analog memory matrix may be implemented on a single integrated-circuit semiconductor chip. The analog memory comprises cells containing sample/hold circuits. Typical sample/hold circuits are shown in FIG. 2, including FIG. 2C which shows a complementary FET switching means. However, the complementary drive signals are obtained within the cell by means of inverter 54 and AND gate 52, and this patent does not show or teach the use of complementary wordlines for providing the complementary drive signals as set forth in the present invention.

U.S. Pat. No. 3,701,120 issued Oct. 24, 1972 to Charters et al, entitled "ANALOG CAPACITOR MEMORY WITH SLOW WRITE-IN AND FAST NON-DESTRUCTIVE READ-OUT" describes an analog memory capable of write-in at a relatively low rate and independent, nondestructive read-out at a relatively high rate. A single write-in and read-out address logic is provided for as memory units are desired. Each memory unit includes a matrix of sample and hold microcircuits, each having an external storage capacitor, an isolation amplifier and independent input and output analog switching in response to vertical and horizontal write-in and read-out addressing.

U.S. Pat. No. 3,457,435 issued July 22, 1969 to Burns et al, entitled "COMPLEMENTARY FIELD-EFFECT TRANSISTOR TRANSMISSION GATE", describes a circuit wherein a pair of field-effect transistors of opposite conductivity type have their source-drain paths connected in parallel. Signals of opposite polarity sense are applied at the gates of the transistors to bias both on or both off simultaneously. The gate comprising complementary FETs is driven by two complementary signals as shown in FIG. 4, in order to eliminate the drop in transmitted voltage due to the threshold voltage of a single FET. This patent does not disclose usage within a DRAM cell.

Patent EP 175-378A of Fujitsu LTD shows three-transistor cell DRAM structure which has read and write select lines combined into one line connected to gates of both read and write select transistors. A write selector transistor is disposed over a read select transistor, the two being separated by an insulator layer and sharing a drain region. A storage transistor is formed on a silicon substrate in the same level as the read select transistor. Channel regions of the two transistors are connected to one another and each is used as a diffusion (source or drain) region of the other two transistors.

Write and read select lines may be combined into a single control line or a write/read select line. Here gate electrodes of the read and write select transistors are connected to the write/read select line and are distinguished by having different threshold voltages.

Other references include U.S. Pat. Nos. 4,434,433; 4,308,595; 4,203,159; 4,044,342; 3,919,569 and IBM Technical Disclosure Bulletins Vol. 23, No. 10, Page 4620 and Vol. 18, No. 3, Page 649.

SUMMARY OF THE INVENTION

An object of the present invention is to provide a complementary MOS one-capacitor dynamic RAM cell which operates with a non-boosted wordline without a threshold loss problem.

Another object of the present invention is to provide a CMOS one storage capacitor DRAM cell that incorporates both n- and p-type transfer devices connected to the storage capacitor.

A further object of the present invention is to provide a true CMOS DRAM cell with two complementary transistor devices having gates controlled by complementary wordlines.

The foregoing and other objects, features and advantages of the invention will be apparent from the following more particular description of the invention as illustrated in the accompanying drawings.

DESCRIPTION OF THE PREFERRED EMBODIMENTS

In integrated circuit technology employing dynamic-random-access-memory (DRAM) cells, as the DRAM density increases, it is important to scale down the area occupied by the DRAM cells, such as the one-transistor and one-capacitor DRAM device.

A general dilemma in scaling down the transfer device in the DRAM cell is that in order to minimize the leakage through an "off" device, it is desirable to have a higher threshold voltage; but conversely, in order to maximize the stored charge and to obtain a higher charge transfer rate, it is desirable that the threshold voltage be small. The conventional way of using a boosted wordline to avoid this problem becomes more difficult as the device dimensions are scaled down; for example, the reduced breakdown voltage of the scaled down device limits the possible boosted wordline voltage level. It is important for DRAMS, therefore, to design a new cell which allows using a non-boosted wordline, but without suffering the threshold loss problem as described.

Figure 1:
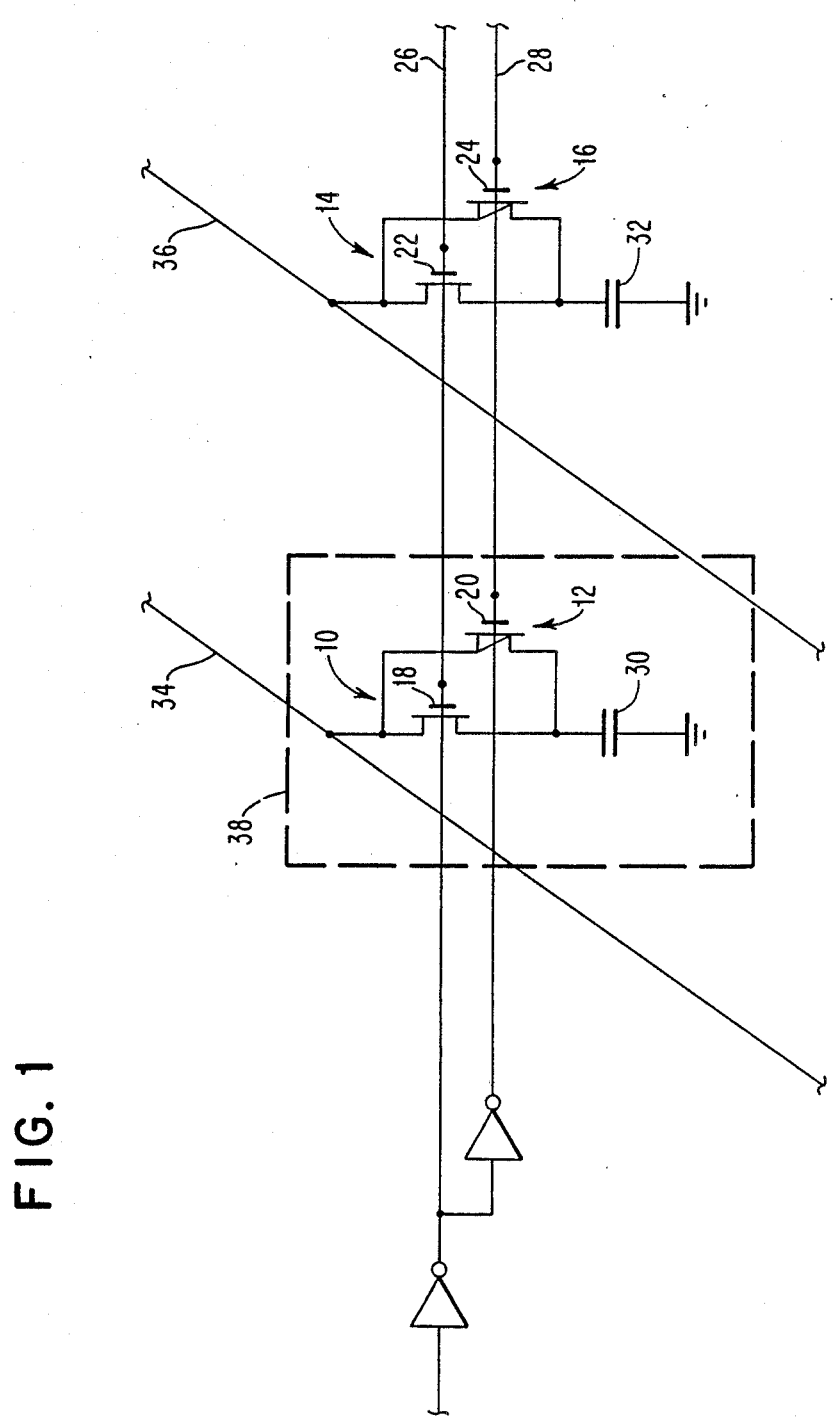
FIG. 1 is a schematic circuit diagram of a CMOS memory cell according to the principles of the present invention.

The present invention provides a Complementary MOS one-capacitor DRAM cell (CMOS-1C cell) which overcomes the described problem. A circuit schematic of an embodiment of the new cell is shown in FIG. 1. The difference from the conventional one-transistor DRAM cell is that instead of having only a single type of transfer device connected to the storage capacitor, there are both an n- and a p-type transfer device in each cell, for example, devices 10,12 and 14,16 in FIG. 1. The gates 18,22 and 20,24 of these complementary devices are controlled by complementary word lines 26 and 28, respectively. At standby, the wordline 26 is low which turns off n-type devices 10,14 and the complementary wordline 28 is high which turns off p-type devices 12,16. For cell 38 which is comprised of the transfer devices 10 and 12, and the storage capacitor 30, the charge is stored on the capacitor 30, isolated from the bitline 34 at standby. When the cell is selected, wordline 26 goes high and complementary wordline 28 goes low to turn on both devices 10 and 12. Complementary devices 10 and 12 comprise a CMOS pass gate, having no threshold loss. As a result, there is no need to boost the wordline voltage level in order to store the full voltage, either the full power supply voltage VDD or zero volts. As a result, the total sense charge can be read from, or stored into, the capacitor 30 through the bitline 34 in a full-VDD amount, i.e., with no threshold loss.

There are several advantages of the described cell: (1) It does not suffer the threshold voltage loss for the charge transfer, even though the wordline voltage level is not boosted, because either VDD or zero can be fully transferred through the PMOS or NMOS, respectively; (2) the signal development is faster because both devices conduct most of the time during charge transfer; and (3) because the cell does not suffer threshold loss and has high charge transfer rate, the transfer devices can be designed to have large absolute values of the threshold voltage in order to suppress leakage.

The present invention provides a fabrication process which overcomes the technological difficulty of how to achieve both PMOS and NMOS devices within the area on the integrated circuit presently occupied by a single device. The present invention also provides a novel cell structure for the CMOS-1C cell, which occupies about the same area as the one-device cell.

Figure 2:
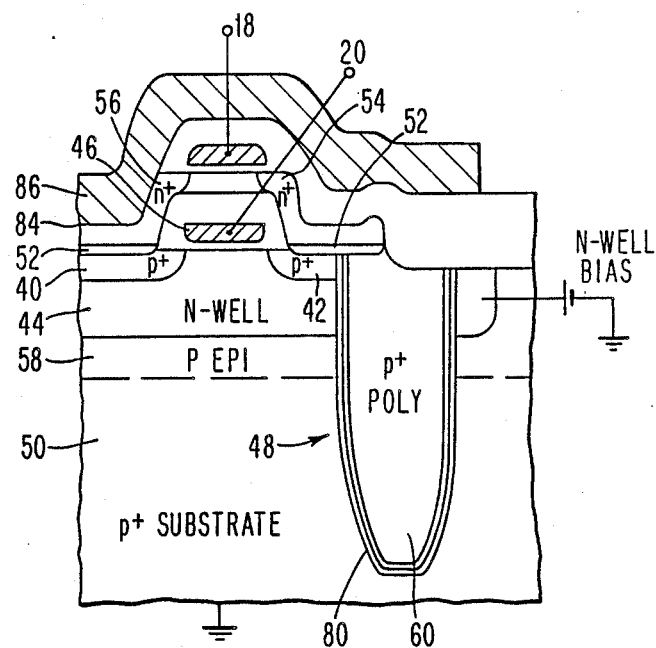
FIG. 2 is a schematic cross-sectional illustration of the structure of a CMOS memory cell according to the principles of the present invention.

FIG. 2 shows a schematic of the cross section of this new cell structure. The CMOS-1C cell of FIG. 2 includes a PMOS device having p+ drain and source regions 40,42, respectively, in n-well 44, and a gate 46. The cell also includes a trench capacitor 48 in a p+ substrate 50. The trench capacitor 48 is connected to the p+ source region 42 of the transfer device through a layer of interconnection 52 called the strap. The strap material, for example, may be titanium silicide, titanium nitride/titanium silicide, or cobalt silicide. Above the PMOS transfer device is the other, n-type, (NMOS) transfer device including source and drain regions 54,56, made in a SOI (silicon-on-insulator) film. Because the strap 52 is conductive to both p- and n-type material, the source and drain regions 42,40 and 54,56 of both NMOS and PMOS devices are connected. Gates 18 of the NMOS device and 20 (also referred to as 46) of the PMOS device are connected, respectively, to wordlines 26 and 28 which are connected to their own individual wordline drivers at the end of the array. The NMOS device and PMOS device of FIG. 2 correspond to devices 10 and 12 of FIG. 1, respectively, and operate as previously described.

Figure 3:
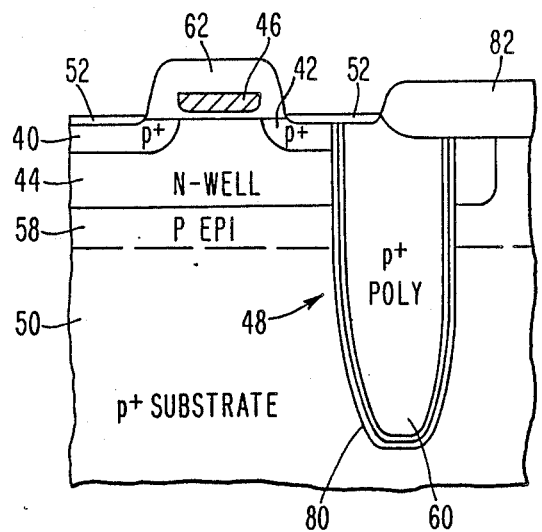
FIGS. 3 and 4 are schematic cross-sectional illustrations of the structure of the CMOS cell of FIG. 2 at certain steps within the fabrication process therefor.
Figure 4:
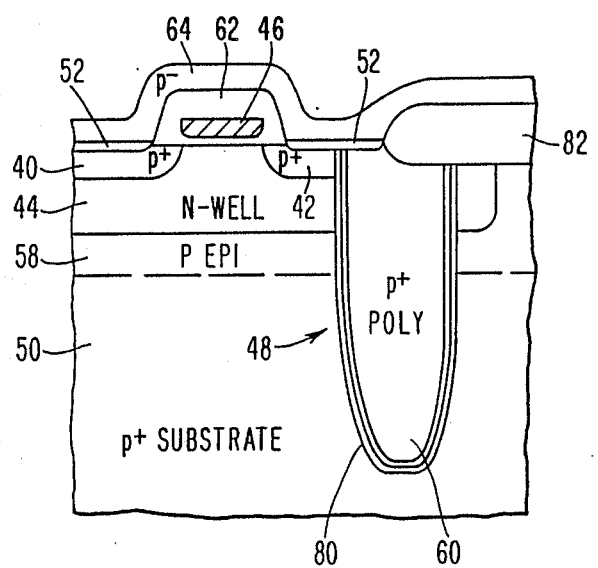

A process to fabricate the cell structure of FIG. 2 will be described. Although the process will be described for one cell, it should be understood that the process applies to the fabrication of a plurality of cells in a dense array. The process consists of the following steps:

Step (1) With a p epitaxial layer 58 disposed on a p+ semiconductor substrate 50, Reactive Ion Etch (RIE) a 5 to 6μm deep trench into the p epi layer 58 and p+ substrate wafer 50. (FIG. 3)

Step (2) Form a composite oxide/nitride/oxide storage insulator 80 on the walls of the trench. (FIG. 3).

Step (3) Fill trenches with p+ polysilicon 60 and planarize.

Step (4) Form a retrograde n-well 44 by two phosphorous implants: a surface implant and a deep implant using 1.6 MeV energy.

Step (5) Grow local oxide isolation region 82.

Step (6) Adjust the threshold voltages of PMOS and peripheral-circuit NMOS devices by a single boron implant.

Step (7) Grow gate oxide and deposit n+ polysilicon gate material 46 and oxide film 62 over the PMOS gate and pattern.

Step (8) Form oxide spacer on gate electrode edges.

Step (9) Implant phosphorous and boron to obtain graded source/drain junctions for PMOS and NMOS devices, respectively.

Step (10) Open surfaces of source/drain regions 42,40 for silicide 52 formation wherein the gate 46 is still protected from said silicide by thick insulator 62 (FIG. 3).

Step (11) Form a lightly doped p-type silicon film 64 over the silicide, and isolation regions, wherein alternatively, said film 64 (11a) is deposited in polycrystalline structure and recrystallized by beam annealing; (11b) film 64 is deposited, in polycrystalline structure and the grain boundary traps are inactive by hydrogen passivation treatment; (11c) an amorphous film 64 is deposited and because of crystalline seeds of silicided p+ source/drain regions, the amorphous film can be converted to single crystal after thermal treatment; or (11d) film 64 is deposited in polycrystalline structure and the p-type doping level is adjusted to give a high threshold voltage, which can be used to minimize the device leakage.

Step (12) Define the NMOS active area and grow thin gate oxide.

Step (13) Adjust n-channel threshold voltages by a boron implant.

Step (14) Deposit n+ polysilicon gate material 18 and pattern. Form oxide spacer on gate electrode edges.

Step (15) Implant arsenic dopants to obtain n+ source/drain junctions 54,56 for n-channel transfer devices and grow oxide to cover the device.

Step (16) Deposit blanket glass film and reflow.

Step (17) Etch contact holes 84, deposit and pattern metal level 86.

This results in the cell structure shown in FIG. 2.

Figure 5:
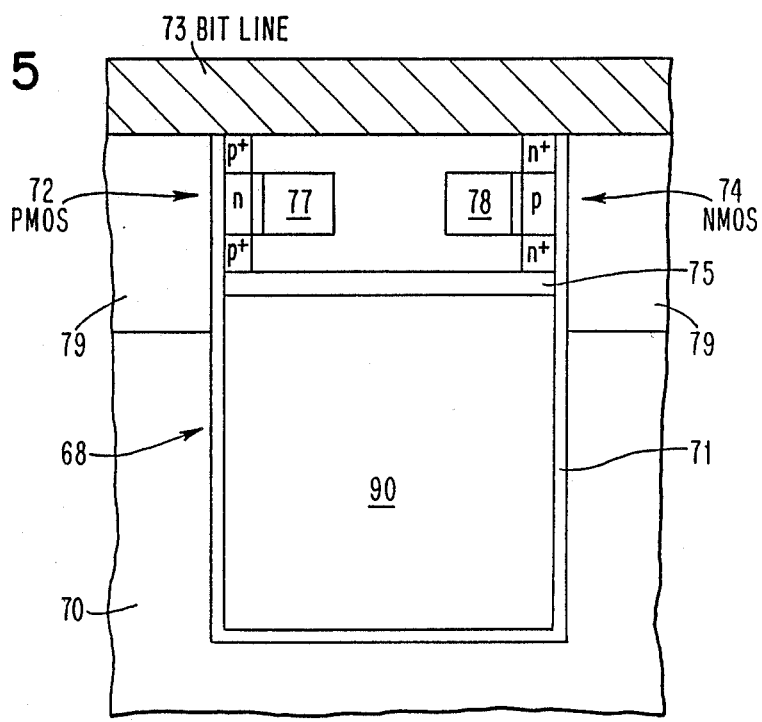
FIG. 5 is a schematic cross-sectional illustration of another embodiment of a CMOS memory cell according to the principles of the present invention.

Another embodiment of a structure of a CMOS-1C cell according to the present invention is depicted in FIG. 5. In this idealized structure, the CMOS pass gate is comprised of the PMOS device 72 and the NMOS device 74; both devices 72 and 74 are vertical transistors, fully insulated from surrounding conducting materials, except for contacts to the bit line 73 and a connecting silicide or metal strap 75. The entire cell, including the poly gates 77 and 78, which are interconnected with the gates of other cells to form complementary wordlines, can be built in trenches 68 etched into a conductive substrate 70 covered by a thick insulator 79. The storage capacitor consists of poly electrode 90, thin oxide dielectric 71, and the plate 70. The poly electrode 90 is interconnected to the device diffusions by the conductive strap 75.

Having thus described our invention, what we claim as new, and desire to secure by Letters Patent is:

1. A method for fabricating a memory cell for a semiconductor memory array comprising the steps of:

Step (1) disposed an epitaxial layer on a semiconductor substrate and reactive ion etch a trench into the said epitaxial layer and substrate, Step (2) form a composite oxide/nitride/oxide storage insulator layer on the walls inside said trench, Step (3) fill said trench with polysilicon and planarize, Step (4) form a retrograde n-well in said epitaxial layer by a surface impurity implant and a deep impurity implant, Step (5) grow gate oxide and deposit polysilicon gate material for a PMOS type device and deposit an oxide film insulator layer over the PMOS gate and lithographically pattern said oxide film layer, Step (6) implant dopants into said n-well to provide graded source/drain junctions for PMOS and NMOS transistor devices, respectively, Step (7) open the surfaces of said source/drain regions for silicide formation wherein said gate element is protected from said silicide by said oxide film insulator layer formed in step (5), Step (8) form a lightly doped silicon film over said silicide, gate oxide and isolation regions wherein said lightly doped silicon film is deposited in polycrystalline structure and recrystallized by beam annealing, Step (9) define the NMOS type transistor device active area and grow thin NMOS gate oxide, Step (10) adjust channel threshold voltages by an impurity implant, Step (11) deposit polysilicon NMOS type transistor device gate material and pattern, Step (12) form oxide spacer regions on said NMOS gate electrode edges, Step (13) implant dopants to obtain source/drain junctions for a transfer device and grow oxide to cover the device.

2. A method for fabricating a memory cell according to claim 1 wherein said substrate is composed of p+ type silicon, said epitaxial silicon layer is p type, said polysilicon filled in said trench in step (3) is p+ type, said n-well formed in step (2) is composed of a phosphorous implant and said source and drain regions of said PMOS and NMOS type transistor devices are formed of phosphorus and boron implants to provide graded source/drain junctions.

3. A method of fabricating a memory cell according to claim 1 wherein said lightly doped silicon film is deposited in polysilicon structure and the grain boundary traps are inactive by hydrogen passivation treatment.

4. A method of fabricating a memory cell according to claim 1 wherein said lightly doped silicon film is deposited amorphous film which is converted to single crystal by thermal treatment and with crystalline seeds of said silicided p+ source/drain region.

5. A method of fabricating a memory cell according to claim 1 wherein said lightly doped silicon is deposited in polycrysatalline structure and the p-type doping level is adjusted to provide a high threshold voltage.

* * * * *